(12) United States Patent
VanMil et al.

(10) Patent No.: US 8,603,243 B2
(45) Date of Patent: Dec. 10, 2013

(54) **TRACKING CARBON TO SILICON RATIO *IN SITU* DURING SILICON CARBIDE GROWTH**

(75) Inventors: Brenda L VanMil, Alexandria, VA (US); Kok-Keong Lew, Hillsboro, OR (US); Rachael L Myers-Ward, Alexandria, VA (US); Charles R. Eddy, Jr., Columbia, MD (US); David Kurt Gaskill, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 858 days.

(21) Appl. No.: 12/183,465

(22) Filed: Jul. 31, 2008

(65) Prior Publication Data

US 2010/0024719 A1  Feb. 4, 2010

(51) Int. Cl.
*C30B 25/16* (2006.01)

(52) U.S. Cl.
USPC ............... 117/86; 117/85; 117/89; 117/93; 117/102; 117/105; 252/502; 252/503; 252/504; 252/506; 252/516; 252/518.1; 252/521.5

(58) Field of Classification Search
USPC ............... 117/85–86, 89, 93, 102, 105, 951; 252/502–504, 506, 516, 518.1, 521.5
See application file for complete search history.

(56) References Cited

U.S. PATENT DOCUMENTS

| 7,163,587 | B2 | 1/2007 | Kinnard et al. | |
|---|---|---|---|---|
| 2002/0072249 | A1* | 6/2002 | Nagasawa et al. | 438/778 |
| 2004/0235299 | A1* | 11/2004 | Srivastava et al. | 438/689 |
| 2006/0278891 | A1* | 12/2006 | Saxler et al. | 257/192 |
| 2007/0107654 | A1* | 5/2007 | Motakef et al. | 117/88 |
| 2007/0119814 | A1* | 5/2007 | Patel et al. | 216/59 |

OTHER PUBLICATIONS

S. Cho, et al. In "In situ chemical sensing in AlGaN/GaN high electron mobility transistor metalorganic chemical vapor deposition process for real-time prediction of product crystal quality and advanced process control," J. Vac. Sci. Technol. B 23, 1386 (2005).*

Cho, et al. "In situ chemical sensing in AlGaN/GaN high electron mobility transistor metalorganic chemical vapor deposition process for real-time prediction of product crystal quality and advanced process control," J. Vac. Sci. TEchnol. B, vol. 23, pp. 1386-1397 (2005).*

Bartram et al., "GaN CVD Reactions: Hydrogen and Ammonia Decomposition and the Desorption of Gallium" MRS Internet J. Nitride Semicond. Res., 4S1, G368 (1999).

Cho et al., "In situ chemical sensing in AlGaN/GaN high electron mobility transistor metalorganic chemical vapor deposition process for real-time prediction of product crystal quality and advanced process control"J. Vac. Sci. Technol. B, 23, 1386 (2005).

(Continued)

*Primary Examiner* — Michael Kornakov
*Assistant Examiner* — Kenneth A Bratland, Jr.
(74) *Attorney, Agent, or Firm* — US Naval Research Laboratory; Joseph T. Grunkemeyer

(57) ABSTRACT

A method of: supplying sources of carbon and silicon into a chemical vapor deposition chamber; collecting exhaust gases from the chamber; performing mass spectrometry on the exhaust gases; and correlating a partial pressure of a carbon species in the exhaust gases to a carbon:silicon ratio in the chamber.

8 Claims, 12 Drawing Sheets

(56) References Cited

OTHER PUBLICATIONS

Foord et al., "Growth and mechanistic studies of diamond formation by chemical beam epitaxy using methyl and acetylene precursors" J. Cryst. Growth, 164, 208 (1996).

Foord et al., "Surface studies of the reactivity of methyl, acetylene and atomic hydrogen at CVD diamond surfaces" Surf. Sci., 399, 1 (1998).

Lofgren et al., "Modeling of Silicon Carbide Epitaxial Growth in Hot-Wall Chemical Vapor Deposition Processes" J. Electrochem. Soc., 147, 164 (2000).

Ponczak et al., "In-Situ Mass Spectrometry for Chemical Identification in SiC Epitaxial Deposition" Mater. Sci. For., 556-557, 121 (2007).

VanMil et al., "In-Situ Measurement of Nitrogen During Growth of 4H-SiC by CVD" Mater. Sci. For., 556-557, 125 (2007).

VanMil et al., "Real-Time In Situ Tracking of Gas-Phase Carbon-to-Silicon Ratio During Hot-Wall CVD Growth of SiC" J. Electon. Mat., 37(5) (2008).

Larkin et al., Appl. Phys. Lett. 65, 26 (1994).

Chen et al., J. Appl. Phys. 98, 114907 (2005).

* cited by examiner

TRACKING CARBON TO SILICON RATIO IN SITU DURING SILICON CARBIDE GROWTH

FIELD OF THE INVENTION

The invention is generally related to the field of silicon carbide growth.

DESCRIPTION OF RELATED ART

In the epitaxial growth of SiC, the site-competition effect results in a strong dependence of the background net carrier concentration on the gas-phase C/Si ratio (Larkin et al., *Appl. Phys. Lett.*, 65, 0326 (1994); Chen et al., *J. Appl. Phys.*, 98, 114907 (2005)). Typically a C/Si ratio of ~1.5 gives a minimum n-type background less than $1 \times 10^{14}$ cm$^{-3}$, the actual ratio varies from system to system. Lower ratios give higher n-type backgrounds while higher ratios result in type conversion to p-type backgrounds. Background carrier concentrations below $10^{15}$ cm$^{-3}$ are desired for power electronic device applications, for example, blocking or drift layers in high-voltage diodes and switches. Such layers can be in excess of 100 μm thick and can require tens of hours to grow. The effective C/Si ratio must be precisely controlled throughout these long epitaxial growths to achieve optimal device performance. A method to measure and control the C/Si ratio during growth would enhance the producibility and performance of high-voltage devices.

Previously, the carbon to silicon ratio was monitored only by the amount of propane (carbon source) and silane (silicon source) introduced into the process flow via mass flow controllers. The only way to determine the actual ratio was by post-growth ex situ electrical measurements. The reaction zone of the system may also contribute to species over the course of an extended growth run, either by decomposition of graphite parts (carbon source) or decomposition of SiC. Changes in hot spots in the reaction zone may also affect the thermal profile influencing the decomposition of the precursors. These can influence the effective C/Si ratio at the growth interface, influencing the background carrier concentration.

Mass spectrometry has been used for detailed investigation of chemical vapor deposition (CVD) growth of III-N (Bartram et al., *MRS Internet J. Nitride Semicond. Res.*, 4S1, G368 (1999); Cho et al., *J. Vac. Sci. Technol. A*, 23, 1386 (2005)) and diamond (Foord et al., *J. Cryst. Growth*, 164, 208 (1996); Foord et al., *Surf. Sci.*, 399, 1 (1998)), however, to date it has only been reported for monitoring the remote exhaust stream of a multiwafer system for SiC (Ponczak et al., *Mater. Sci. For.*, 556-557, 121 (2007)). Modeling by Lofgren et al., *J. Electrochem. Soc.*, 147, 164 (2000) of the reaction mechanisms using the standard chemistry of propane ($C_3H_8$) and silane ($SiH_4$) as precursors in a hot-wall chemical vapor deposition (HWCVD) reactor has predicted the downstream gas composition. Such efforts motivate mass spectrometry sampling of the downstream portion of SiC CVD reactors, but in a manner that limits the influence of wall reactions and enhances the relationship of sampled species to those existing in the growth zone of such systems.

SUMMARY OF THE INVENTION

The invention comprises a method comprising: supplying sources of carbon and silicon into a chemical vapor deposition chamber; collecting exhaust gases from the chamber; performing mass spectrometry on the exhaust gases; and correlating a partial pressure of a carbon species in the exhaust gases to a carbon:silicon ratio in the chamber.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

Figure 1:
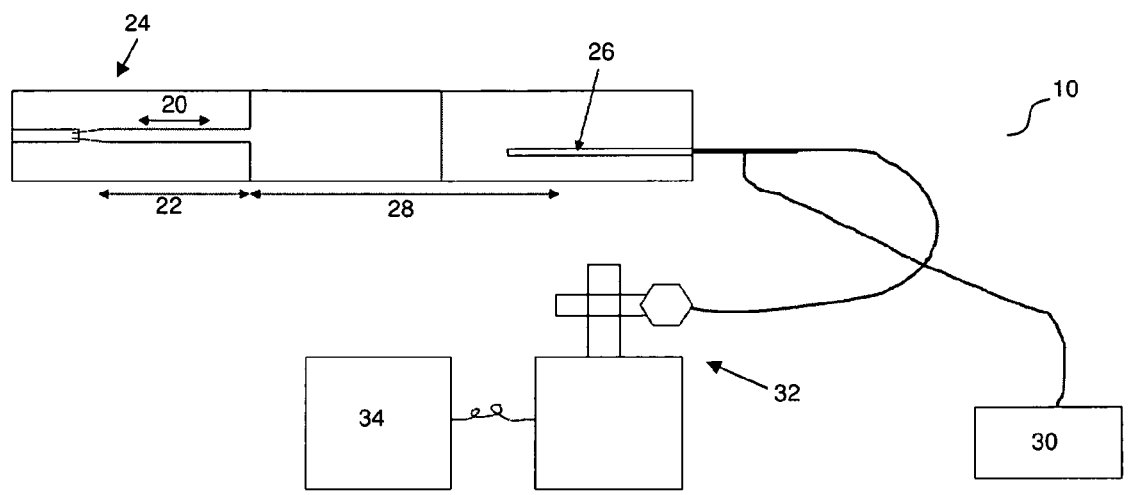
FIG. 1 schematically illustrates an apparatus for use with the method.

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

The method disclosed herein may be used to track the carbon-to-silicon ratio in situ using mass spectrometry during silicon carbide growth by hot-wall chemical vapor deposition for tight control of epilayer properties of silicon carbide films that are unintentionally doped for enhanced lifetime and performance of high power and high voltage power electronic devices. The old method for controlling the carbon to silicon ratio measured the introduction of precursors into the system. Monitoring of the magnitude of the acetylene or methane QMS peak measures the resulting products of the reaction in the system including all real variations in the system such as drift of the introduced precursors, influences from degradation of components of the system and influences from changes in temperature distribution. This in situ real-time diagnostic permits real-time adjustment of growth parameters giving tighter control of intrinsic doping characteristics enabling optimal growth of thick SiC blocking layers for power electronics.

In situ real-time tracking of certain downstream reaction products may be implemented as a feedback control mechanism for precursor inlet flows to control the C/Si ratio actively. Monitoring the magnitude of certain peaks measures the resulting products of reactions in the system, which is influenced by many real variations of the system including the drift of the introduced precursor flows, degradation of the components of the system, and decomposition of parasitic SiC deposits. Changes in reaction-zone hot spots may also affect the hot-zone thermal profile, influencing the decomposition of the precursors. These can also impact the effective C/Si ratio at the growth interface, altering the background carrier concentration.

Experiments have demonstrated the capability to monitor the gas-phase C/Si ratio during HWCVD of SiC films. In addition it was found that, by holding one precursor constant and varying the second precursor, the carbon derivative peaks have a direct linear correlation with the precursors $C_3H_8$ and $SiH_4$, thus demonstrating that these acetylene and methane peaks can be tracked to yield real-time in situ measurements of changes in the C/Si ratio. Monitoring the magnitude of the acetylene or methane QMS peak measures the products of the reaction in the system, including all real variations in the system such as drift of the introduced precursors, influences from degradation of components of the system, and influences from changes in temperature distribution.

This in situ diagnostic permits real-time adjustment of the growth parameters during SiC growth by HWCVD, enabling tighter control of the intrinsic doping characteristics of unintentionally doped SiC films for enhanced carrier lifetime and performance of high-power and high-voltage power electronic devices.

In some embodiments, the conditions in the chamber are effective to cause growth of silicon carbide on the substrate. Such conditions are known in the art. During a growth process, the amount of the carbon and silicon sources used may be continuously adjusted in response to the carbon:silicon ratio. This may be done to maintain the consistency and correctness of the ratio for extended growth periods.

The correlation may be done by one of at least two methods. In one, a calibration curve is generated for the system to be used. Examples of this are shown below. Once the curve is generated, the carbon:silicon ratio is determined from monitoring the carbon species. This method may be used for SiC growth, as the silicon species may not be detected in the exhaust under growth conditions.

In the other method, the partial pressures of both the carbon and silicon species are monitored. The ratio of the two produces the carbon:silicon ratio. This method may be useful at lower temperatures than those used for SiC growth.

Suitable species for monitoring include, but are not limited to, acetylene species having a mass of 26, 25 and 24 amu, methane species having a mass of 16, 15 and 14 amu and silane species having a mass of 28-31 amu.

The exhaust gases may be collected by a tube that is made of a material that is not degraded during a silicon carbide growth process. The closer the entrance of the tube to the growth site, the more accurate the measurements may be. However, some distance may be needed to avoid melting or otherwise degrading the tube. A stainless steel tube may be used if positioned to avoid melting. A silicon carbide tube may be positioned closer. The tube may be positioned so that the collection occurs at a point having a direct line of sight to the growth location, or so that laminar flow of the exhaust gases reaches the collection point.

Any substrate may be used, including, but not limited to, substrates suitable for silicon carbide growth, such as a 4H—SiC substrate, a 6H—SiC substrate, a 3C—SiC substrate, or any other polytype SiC substrate.

FIG. 1 schematically illustrates an apparatus 10 for use with the method. A reaction zone 20 and a susceptor 22 are within a reactor 24. A sampling tube 26 within a downstream region 28 collects the exhaust gases. A pump 30 may be used to assist in drawing the gases into the tube 26. The gases are fed to a mass spectrometer 32 coupled to a computer 34 for analysis.

Figure 2:
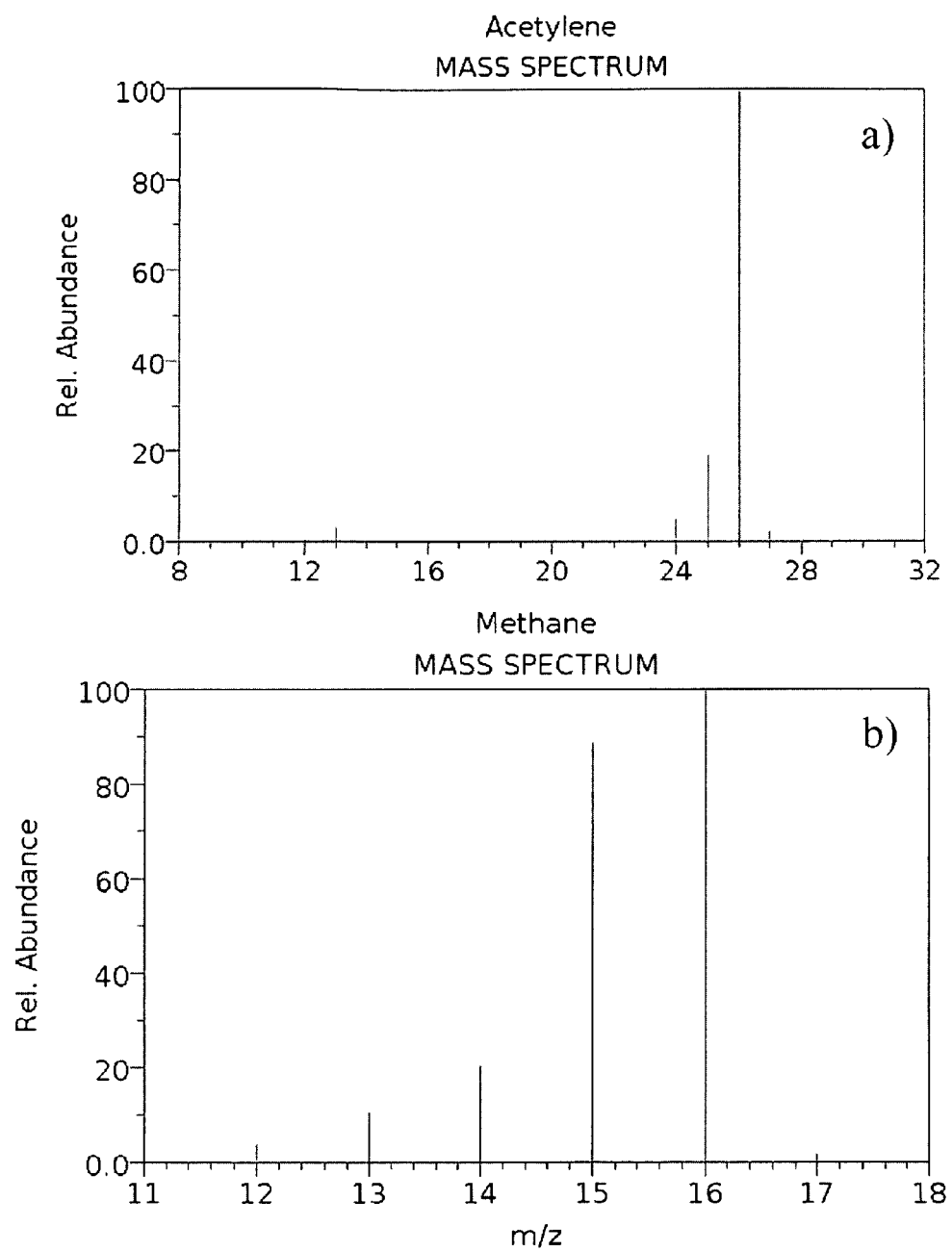
FIG. 2 shows reference mass spectra of carbon species.

The method may be carried out using any combination of CVD silicon carbide reactor and mass spectrometer, including a quadrupole mass spectrometer. Each reactor may have different inherent gas phase chemistry and may need its own calibration. Different precursor gases (e.g. ethane, halocarbons and halosilanes) could also be used, and again would require their own calibrations. The 26 amu peak may be used because it has the highest relative peak magnitude of the acetylene fragmentation pattern (FIG. 2a). The 25 and 24 amu acetylene peaks can also be used. The 16, 15 and 14 amu methane peaks (FIG. 2b) may also be used.

Having described the invention, the following examples are given to illustrate specific applications of the invention. These specific examples are not intended to limit the scope of the invention described in this application.

EXAMPLE 1

Equipment—Mass spectra were collected in situ with a Hiden Analytical HPR-20 QIC gas analysis system downstream of the reaction zone in a commercial Aixtron/Epigress VP508GFR HWCVD SiC reactor. The reactor was modified with a differentially pumped 4.3 mm ID stainless-steel tube placed in the downstream portion of the process cell such that it was approximately 40.6 cm from the end of the reaction zone. The stainless-steel tube was then coupled directly to a 0.30 mm heated fast-sampling inert quartz capillary (QIC), which was differentially pumped before the reaction gases passed through a 0.02 mm platinum orifice into the quadrupole mass spectrometer (QMS), resulting in a final pressure reduction to $2.0 \times 10^{-6}$ Torr to optimize the signal. The pressure in the process cell was maintained at a nominal 75 Torr. Temperature was measured using a two-color pyrometer focused on an exposed, downstream portion of the rotating satellite that held the substrate during growth. All samples were grown on research-grade 4H—SiC, $n^+$-type substrates cut 8° off <0001> in the <11-20> direction, except where noted as being 4° offcut.

Two different experimental configurations were used. Configuration 1 used a custom-designed 1800° C. susceptor and graphite foam insulation (GFI) kit. The hydrogen flow was 50 standard liters per minute (slm) and no argon flow was used. For configuration 2, a standard 1600° C. susceptor and GFI kit designed for the VP508 were used with a hydrogen flow of 80 slm and an argon flow through the GFI of 3 slm. It was determined that the maximum growth rate, using the standard propane-silane chemistry, without degradation of surface morphology for both configurations, was achieved at ~10 μm/h. For both configurations in this system, a $SiH_4$ inlet flow of 20 standard cubic centimeters per minute (sccm) gave a growth rate of ~5 μm/h for the carbon-stable regime (i.e., C/Si>1). Samples grown in configuration 2 were all grown at 5 μm/h. Gas handling details for the system and substrate preparation specifics are reported by VanMil et al., *Mater. Sci. For.*, 556-557, 125 (2007).

EXAMPLE 2

Growth experiments—The reactor in this study typically gives a minimum n-type background of less than $1\times10^{14}$ cm³ for a C/Si ratio of 1.5, however, the actual ratio for such background carrier levels varies from system to system. In configuration 1, mass spectra were taken of SiC growth precursors, $SiH_4$, and $C_3H_8$, independently and together through the reaction zone at temperatures of 20° C., 1000° C., 1400° C., and the growth temperature of 1580° C. At each of these temperatures, mass spectra were collected over a range of 10 to 36 amu to determine which downstream products could be observed. In these experiments, the $C_3H_8$ inlet flow was first varied stepwise over a range of 4.3-6.7 sccm while the $SiH_4$ inlet flow was held constant at 10 sccm. The $SiH_4$ inlet flow was then varied stepwise over a range of 7.7-11.9 sccm while the $C_3H_8$ inlet flow was held constant at 5.2 sccm. These variations permitted deviations in the gas phase C/Si ratio from 1.3 to 2.0, resulting in a reasonable range for the growth of low unintentionally doped n-type epilayers in this reactor.

In configuration 2, a number of epilayers were grown at 1580° C., each at a constant growth rate but with a different C/Si ratio. Additionally, two samples were grown while varying both precursor flows. During these growths, mass spectra were taken over a range from 5 amu to 70 amu. The first sample was grown under a varying $C_3H_8$ inlet flow, ranging from 6.7 sccm to 17.3 sccm with a constant $SiH_4$ inlet flow of 20 sccm. The second sample was grown under a varying $SiH_4$ inlet flow, ranging from 11.52 sccm to 30 sccm, with a constant $C_3H_8$ inlet flow of 10 sccm. Here, the gas-phase C/Si ratio investigated was over a larger range of 1.0-2.6.

The observed mass spectra always contained a background air signal consisting of nitrogen, water, and oxygen. The QMS system has a liquid-nitrogen-cooled trap that helps to reduce these background signals. However, the resident $N_2$ peak at 28 amu is still large enough to distort many of the other signals such as those due to Si and hydrocarbons, including the primary and secondary (29 and 28 amu) $C_3H_8$ ionization peaks. The 27 amu peak is the third largest ionization peak for $C_3H_8$, and was thus tracked for the experiments where a $C_3H_8$ partial pressure was observed. Reference mass spectra are taken from the National Institute of Standards and Technology (NIST) database (http://webbook.nist.gov/chemistry).

Figure 3:
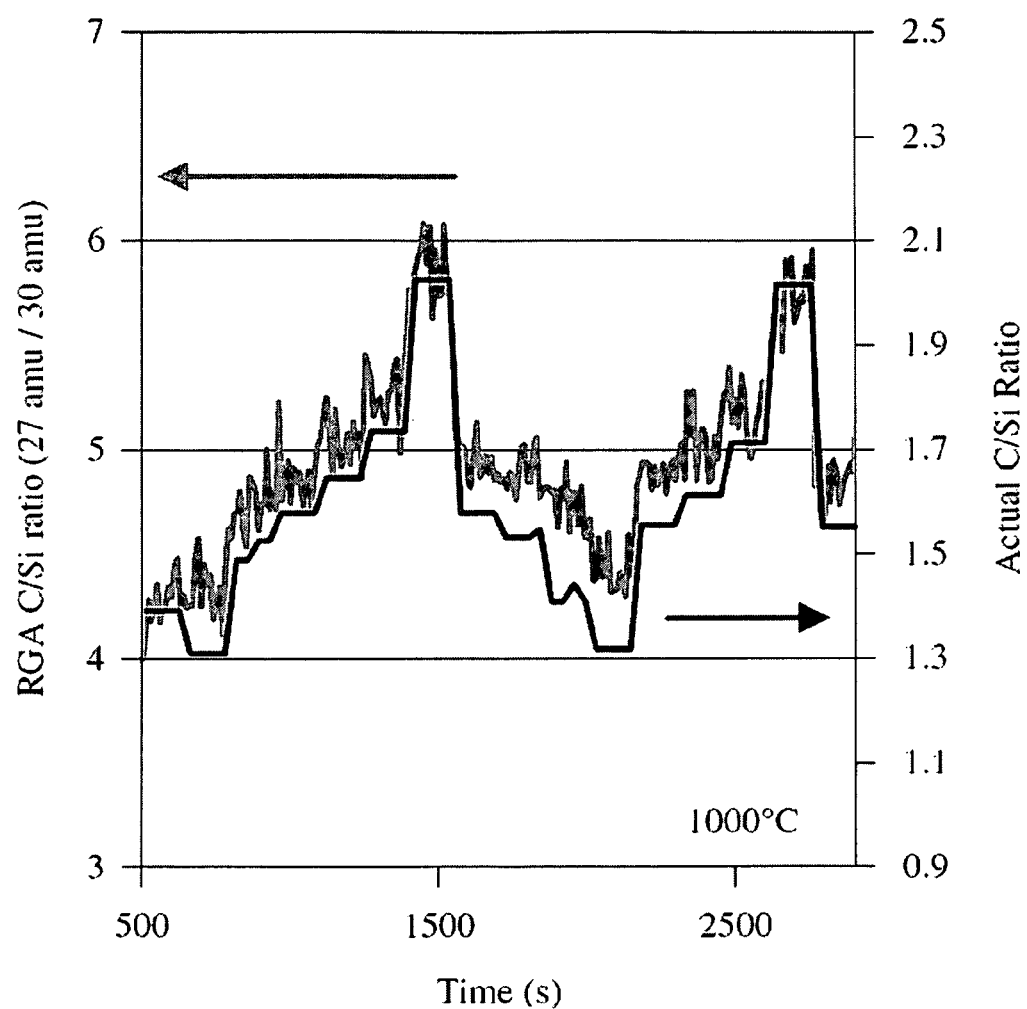
FIG. 3 shows the correlation between the C/Si ratio based on input precursors with that measured by downstream reaction gases at 1000° C. measured by the 27 amu ($C_3H_8$) and 30 amu ($SiH_4$) peaks.

The initial experiments at various temperatures determined which reaction species could be observed. At room temperature (not shown) and at 1000° C. (FIG. 3), the C/Si ratio could be tracked using the 27 amu peak for $C_3H_8$ and the 30 amu peak (primary ionization peak) for $SiH_4$. The two ratios at 1000° C. had a correlation coefficient ($R^2$) of 0.959. At 1400° C. there was no longer a correlation between the input C/Si ratio and the ratio using the $C_3H_8$ and $SiH_4$ ionization peaks. This result is presumably due to the efficient dissociation of both $C_3H_8$ and $SiH_4$ in the reaction zone. At this temperature there are indications of a qualitative relationship between the input C/Si ratio and the peaks observed at 15, 16, 25, and 26 amu. These peaks are suggestive of carbon-based reaction products as the primary and secondary peaks for $CH_4$ ($C_2H_2$), which are 16 and 15 (26 and 25), respectively. At the growth temperature of 1580° C. the mass spectrum shows partial pressures for methane ($CH_4$) and acetylene ($C_2H_2$) that correlate with the input C/Si ratio. The 26 amu peak ($C_2H_2$) exhibits the best signal-to-noise ratio of any of the observed peaks, and thus this peak was used for the remainder of the study. Note that the 16 amu peak of methane also follows similar but differently sloped trends at the growth temperature, but was not used because of its lower signal-to-noise ratio.

Figure 4:
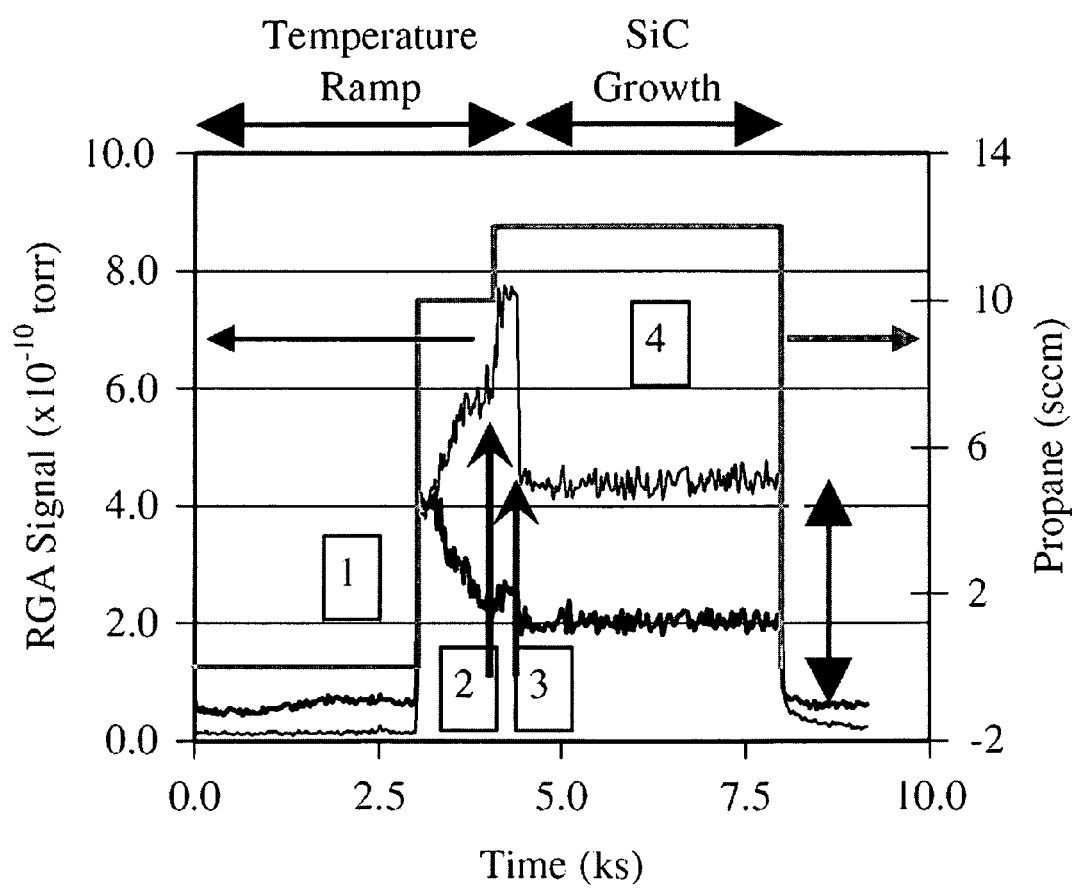
FIG. 4 shows an observation of downstream $CH_4$ (16 amu, lower intensity of $2 \times 10^{-10}$ Torr in region 4) and $C_2H_2$ (26 amu, higher intensity of $4.4 \times 10^{-10}$ Torr) pressures for a standard growth run. The stepped grey line indicates the $C_3H_8$ flow into the system.

Each epitaxial growth run has a unique reaction product signature depending on the temperature, precursors, dopants, outgassing, and additional products from the susceptor or parasitic SiC growth. Understanding the uniformly unintentionally doped product signature with a nondegraded susceptor and GFI kit with minimal SiC deposits allows interpolation of the signals derived from these sources. It is also necessary to determine whether intentional changes from run to run are consistently correlated with the observed spectra to establish the reliability of the method. For an unintentionally doped SiC epilayer growth with a minimum electron carrier concentration (less than $1\times10^{14}$ cm$^{-3}$n-type) using configuration 2, the reactor was tuned to a C/Si ratio of 1.8. An example spectrum observed by the QMS during a 1 h growth is shown in FIG. 4. Initially, as shown in region 1, the reactor temperature ramped from room temperature to 1400° C. without any precursor gases flowing. Minimal hydrocarbon outgassing occurred during this temperature ramp. At 1400° C., to suppress silicon droplet formation and to help suppress etching of the TaC— or SiC-coated pieces of the susceptor, a 10 sccm $C_3H_8$ inlet flow was introduced and $CH_4$ (16 amu, lower intensity of $2\times-10^{-10}$ in region 4) and $C_2H_2$ (26 amu, higher intensity of $4.4\times10^{-10}$ in region 4) pressures appeared. The $C_3H_8$ inlet flow is represented schematically by the stepwise grey line. The temperature continued to ramp to 1580° C. and further reaction of $C_3H_8$ was observed, as indicated by the pointer in region 2, where the $CH_4$ partial pressure decreased and the $C_2H_2$ partial pressure increased. Thus, for a given temperature, the $CH_4$ or $C_2H_2$ partial pressures showed similar trends, but were subject to different chemistry as indicated by the opposite slopes in this region. Once the reactor reached the growth temperature, the $C_3H_8$ inlet flow was adjusted to the growth condition of 12 sccm and stabilized for 5 min. The pointer for region 3 indicates the onset of growth when 20 sccm of $SiH_4$ was added to the reactor. The instant decrease in the $CH_4$ and $C_2H_2$ pressures was related to the amount of carbon consumed in the growth of SiC in the reactor. Region 4 shows the steady $CH_4$ and $C_2H_2$ pressures during the growth of the epilayer. At the conclusion of the run, the precursor gas flows were stopped and the temperature ramped to room temperature.

Figure 5:
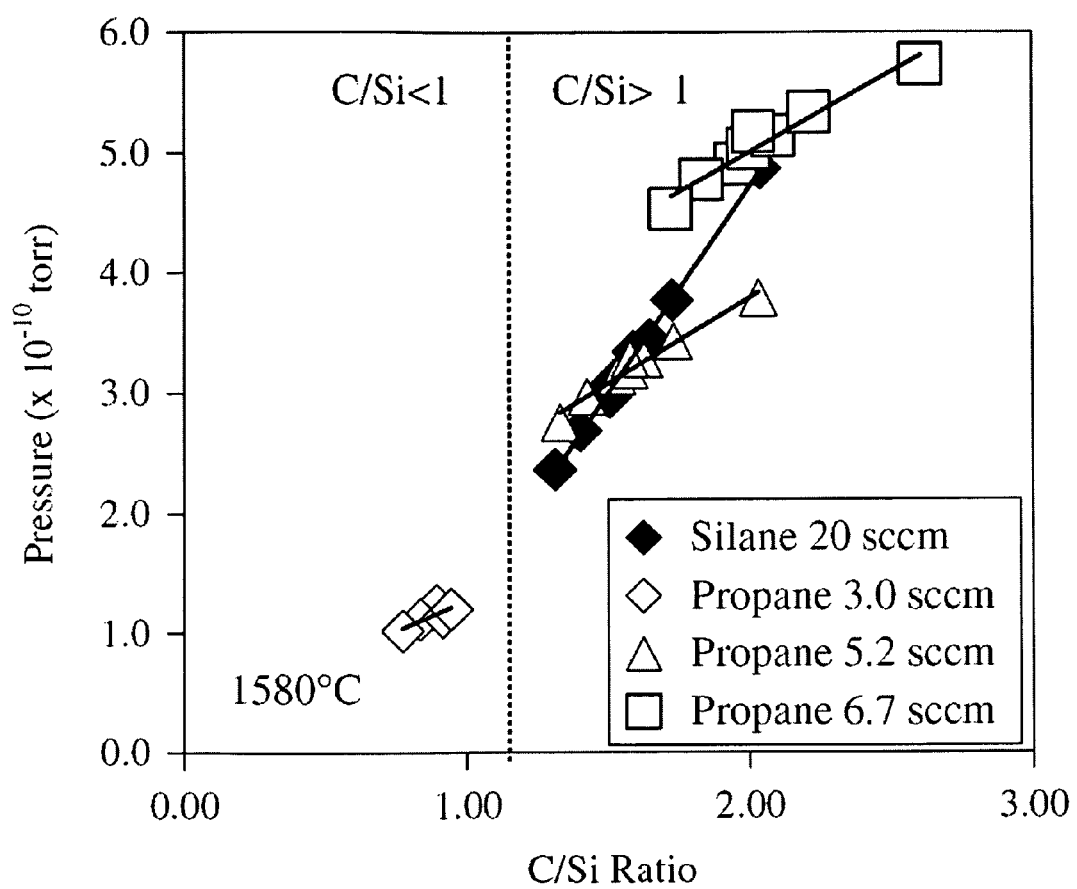
FIG. 5 shows linear correlations between the input C/Si ratio and the observed 26 amu pressure. Different slopes are observed depending on which precursor is varied. Smaller slopes are observed when the $SiH_4$ is varied and the $C_3H_8$ is held constant.

Within a single growth run, in configuration 1, repeatability was established by holding one precursor constant and varying the other precursor in a stepwise fashion over the entire range of C/Si ratios for 3>C/Si>1. A linear correlation was demonstrated, with a different slope depending on which precursor is varied, as shown in FIG. 5. For the case where the $C_3H_8$ precursor inlet flow was held constant and the $SiH_4$ inlet flow was varied, the slopes of the curves are similar and smaller than for the opposite case where the $SiH_4$ precursor inlet flow was held constant. Each set of data was fitted using a least-squares fitting routine. The $R^2$ value for constant $SiH_4$ inlet flow and varied $C_3H_8$ inlet flow was 0.9969. The $R^2$ values for constant $C_3H_8$ inlet flow at 3.0, 5.2, and 6.7 sccm and varied $SiH_4$ inlet (low were 0.6815, 0.9726, and 0.9526, respectively. For the poor correlation of $C_3H_8$ inlet flow at 3.0 sccm, where C/Si<1, the conditions entered the silicon-stable regime and thus large variations in $SiH_4$ input have a minimal effect on the consumption of carbon products. The carbon products are almost entirely consumed by the $SiH_4$ inlet flows, limiting the variation in the observed signal. The slope for the case with varied $SiH_4$ is dependent on the carbon consumption during growth, whereas for the case of varied $C_3H_8$, adjustments in the magnitude of the carbon species due to increased $C_3H_8$ are observed. This shows for the carbon-stable regime (C/Si>1) that there is a direct dependence on whether the $SiH_4$ or $C_3H_8$ source is varying on how the $C_2H_2$ peak varies downstream of the reaction zone. For Si-face SiC epilayers, the carbon-stable regime is the most technologically relevant as it yields the desired minimal background doping level.

Figure 6:
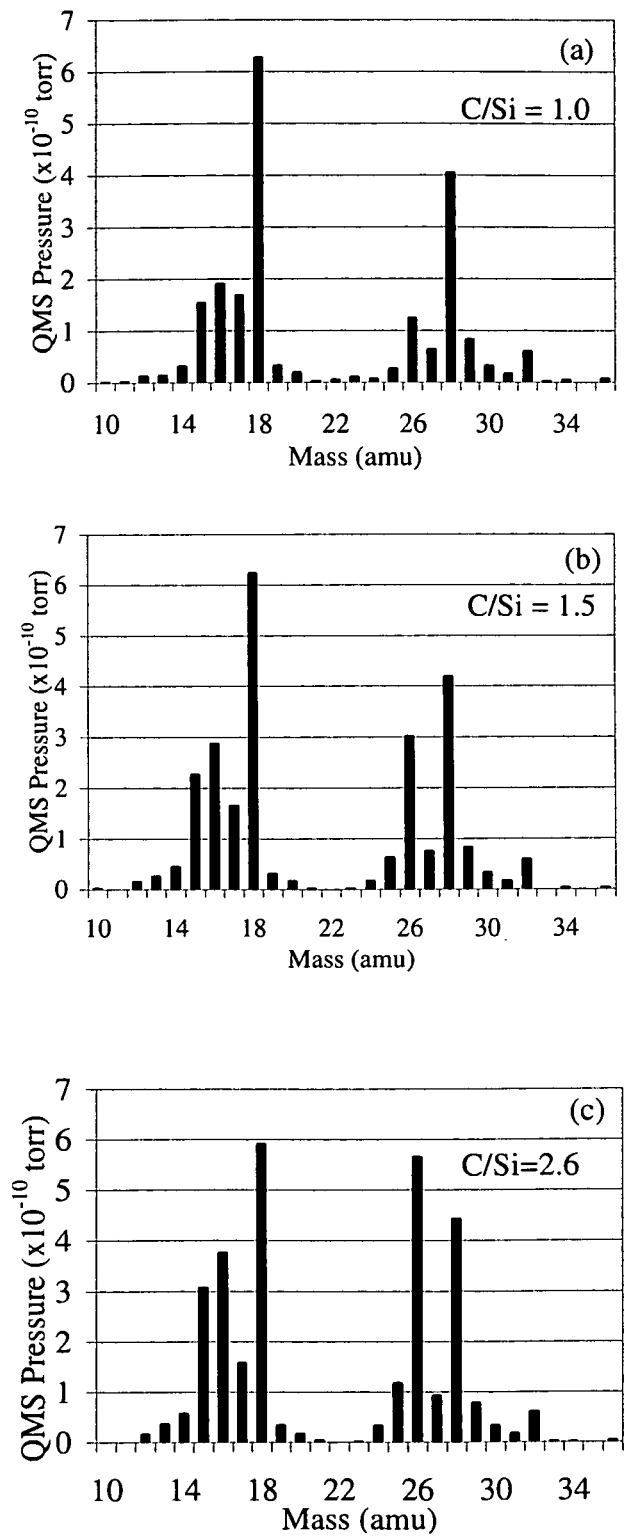
FIG. 6 shows mass spectrometry spectra for C/Si ratios of (a) 1.0. (b) 1.5, and (c) 2.6. For increasing C/Si ratio the $C_2H_2$ peak increases while the $CH_4$ peak decreases relative to the $C_2H_2$ peak.

Lofgren et al., *J. Electrochem. Soc.*, 147, 164 (2000) predicted a gas composition for a reactor configuration similar to the one used in this study with a C/Si ratio of 1.0. They show that $C_3H_8$ decomposes quickly, resulting in mainly $CH_4$ and $C_2H_4$. Further downstream, the $C_2H_4$ decomposes into $C_2H_2$. For growth temperatures above 1427° C., the main carbon contributor to growth is $C_2H_2$. They also state that the mole fraction of $CH_4$ is an order of magnitude higher than that for $C_2H_2$ downstream of the susceptor. The downstream reaction products observed in this experiment confirm the prediction for observation of $C_2H_2$ and $CH_4$, however, it showed that for the growth temperature of 1580° C. and a C/Si ratio of 1.0, the $CH_4$ value is only twice the magnitude of that for $C_2H_2$, as shown in FIG. 6a. FIGS. 6b and 6c show that, with increasing C/Si ratio, the $CH_4$ peak drops relative to the $C_2H_2$ peak, and that the $C_2H_2$ is the larger (a) magnitude peak for the relevant growth regime for low-doped material when C/Si ~1.5.

Figure 7:
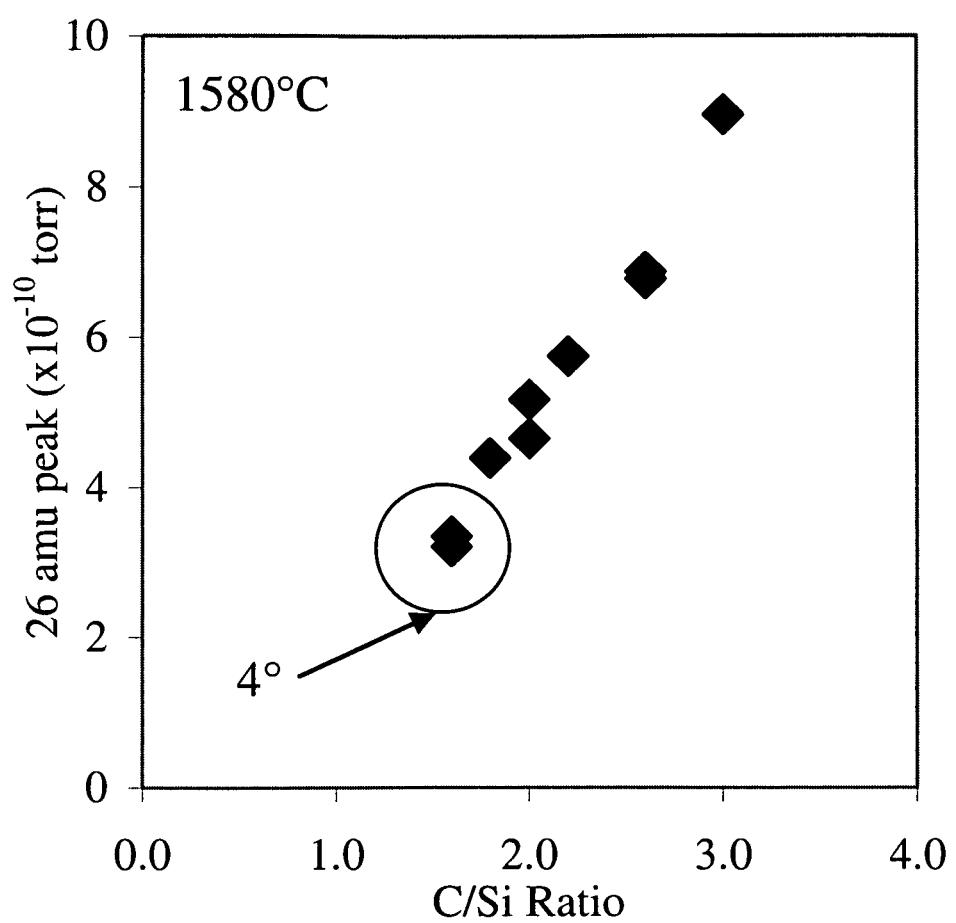
FIG. 7 shows that spectra taken during a number of uniform growths of 5-μm-thick 4H—SiC epilayers gave a definite linear relationship for the C/Si ratio to the acetylene peak with run-to-run repeatability.

A number of standard SiC epilayers where grown for a range of C/Si ratios, all with the same $SiH_4$ inlet flow. By measuring the difference between the background signal and that during the growth itself, (indicated by the vertical arrow on the right of FIG. 4), an effective measure of the excess carbon can be taken which is linked to the C/Si ratio. FIG. 7 shows the correlation between the input C/Si ratio and the measured $C_2H_2$ partial pressure employing such an analysis. Note that for the sample grown at a C/Si of 3.0, capacitance-voltage (C-V) measurements showed that the material was p-type and atomic force microscopy (AFM) showed that it had very poor surface morphology. Two samples grown on 4° off-cut substrates also fitted the same trend. This correlation demonstrates that there is a run-to-run repeatability for using these measurements to track changes in the C/Si ratio.

Figure 8:
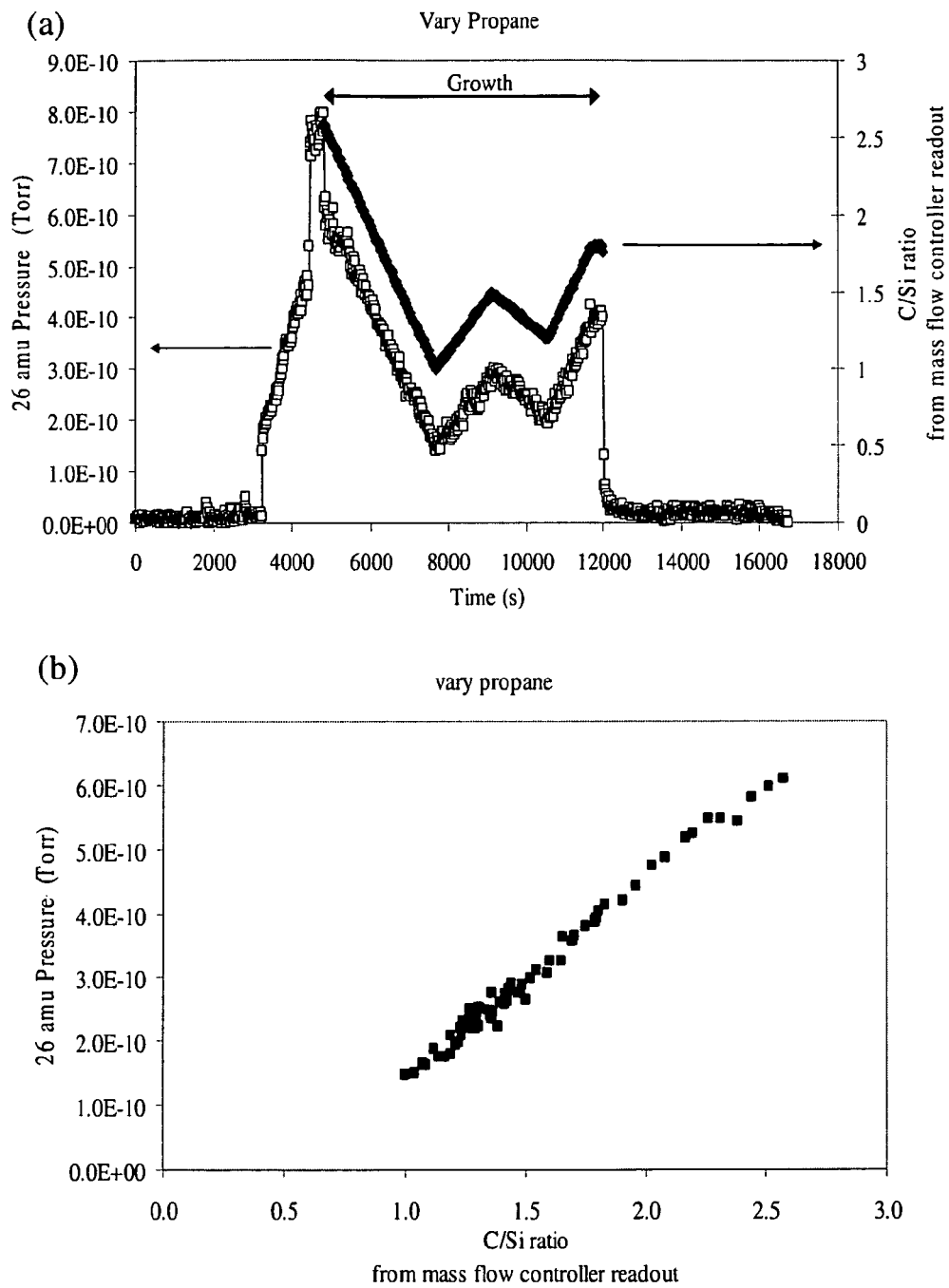
FIG. 8 shows variations in the 26 amu peak for the sample grown with a constant $SiH_4$ flow of 20 sccm and a variable $C_3H_8$ flow, (a) For the Si-stable growth regime, increases in $C_3H_8$ result in larger acetylene partial pressures. (b) Intentional $C_3H_8$ variations correlate carbon variations to the acetylene peak.
Figure 9:
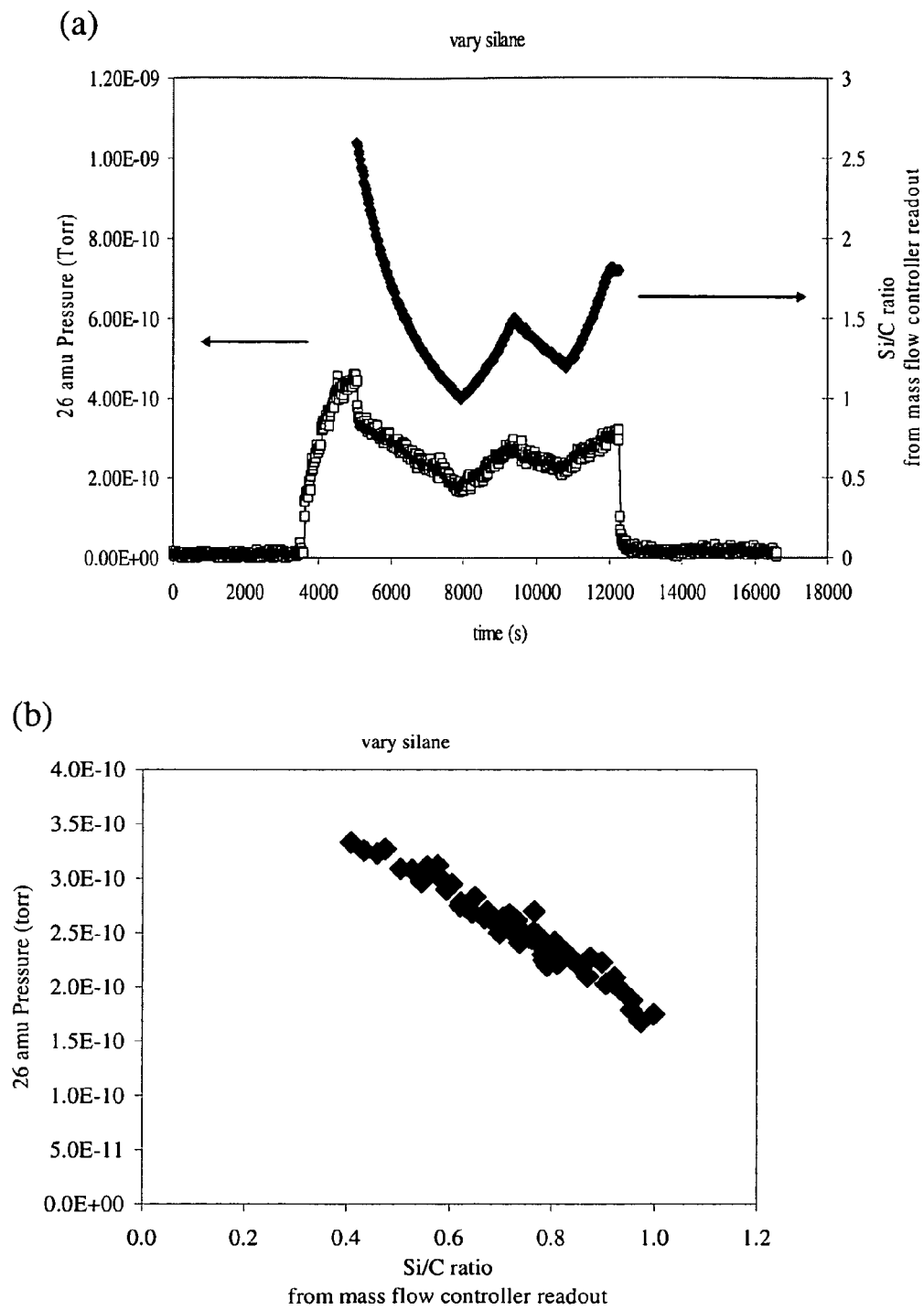
FIG. 9 shows variations in the 26 amu peak for the sample grown with a constant $C_3H_8$ flow of 10 sccm and a variable $SiH_4$ flow, (a) Increases in $SiH_4$ decrease the acetylene peak due to increased consumption of carbon during the growth process, (b) Intentional $SiH_4$ variations correlate silicon variations to the acetylene peak.

Two samples were grown to investigate how real-time continuous changes in precursor flows influenced the downstream reaction components. Both samples experienced four identical C/Si ramps from 2.6 to 1.0 to 1.5 to 1.2 to 1.8. The first sample was grown with a constant $SiH_4$ inlet flow of 20 sccm and a variable $C_3H_8$ inlet (low ranging from 6.7 sccm to 17.3 sccm. The $C_2H_2$ peak from this growth is shown in FIG. 8a. FIG. 8b shows the linear correlation between the 26 amu peak and the $C_3H_8$ precursor flow during growth. The least-squares fit for varying the $C_3H_8$ precursor had an $R^2$ value of 0.9889. This indicates that excess carbon precursors result in excess carbon reaction products and is indicative of the C/Si ratio in the reaction zone. The second sample was grown with a constant $C_3H_8$ inlet flow of 10 sccm with a variable $SiH_4$ inlet flow ranging from 11.5 sccm to 30 sccm and is shown in FIG. 9a. FIG. 9b shows the linear correlation between the 26 amu peak and the $SiH_4$ precursor (i.e., the Si/C ratio) during the growth. The least-squares fit varying the $SiH_4$ precursor had an $R^2$ value of 0.9548. The negative slope shows that, with increasing $SiH_4$ precursor, the quantity of carbon reaction products decreases due to consumption of carbon during the growth of the SiC.

EXAMPLE 3

Figure 10:
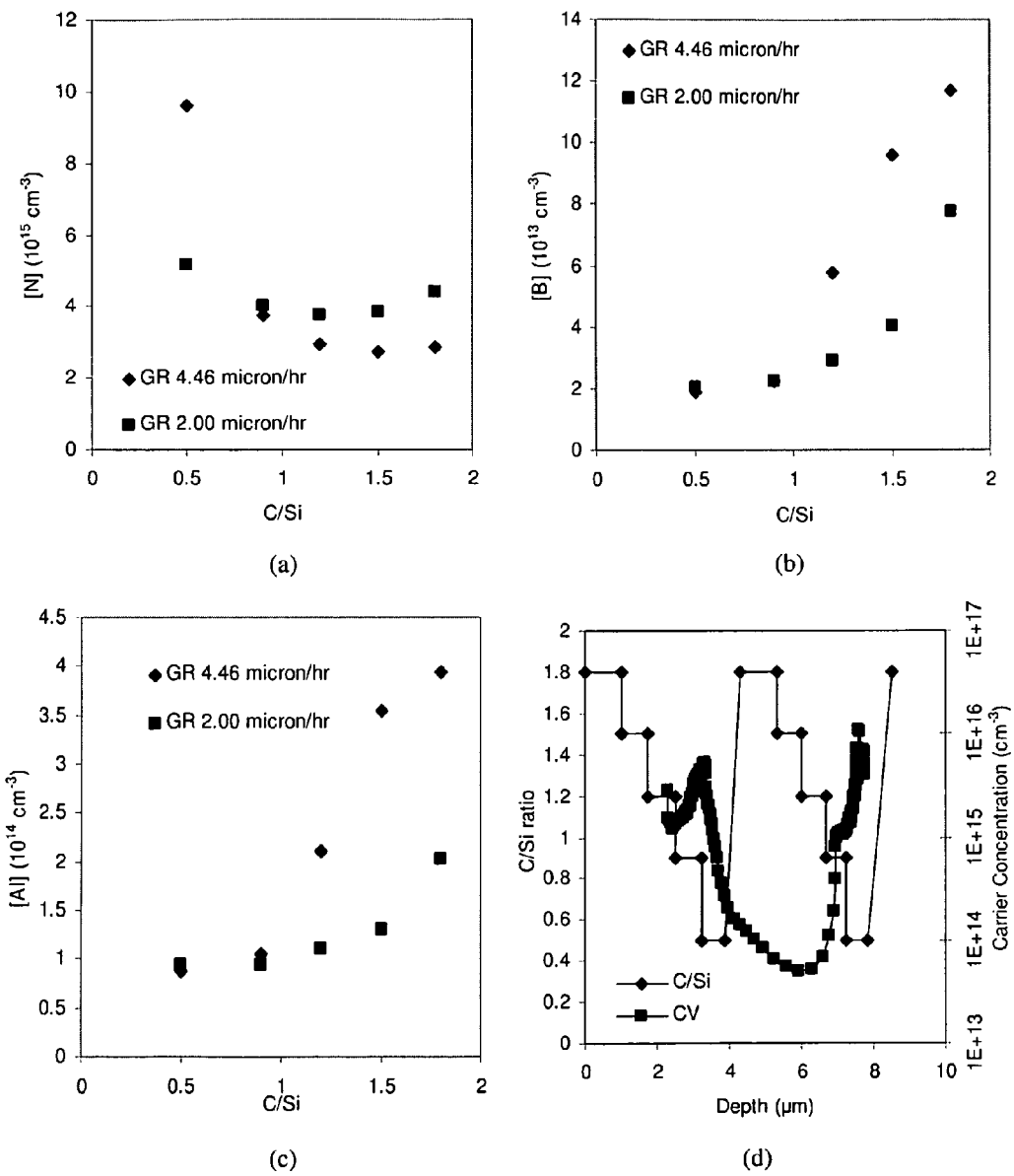
FIG. 10 shows the concentration of N, B, and Al as a function of C/Si ratio and total carrier concentration while the amount of the propane feed was varied.
Figure 11:
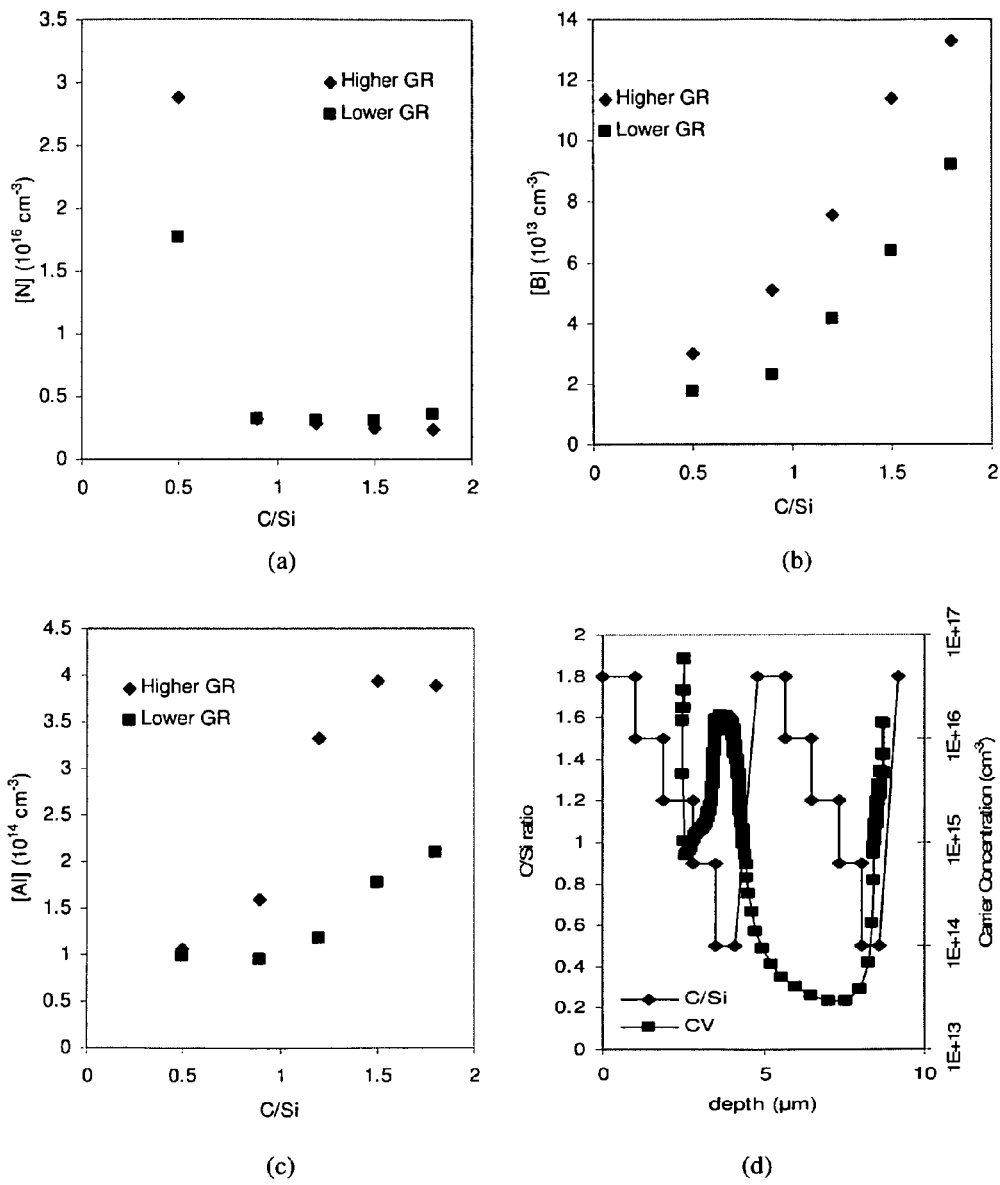
FIG. 11 shows the concentration of N, B, and Al as a function of C/Si ratio and total carrier concentration while the amount of the silane feed was varied.
Figure 12:
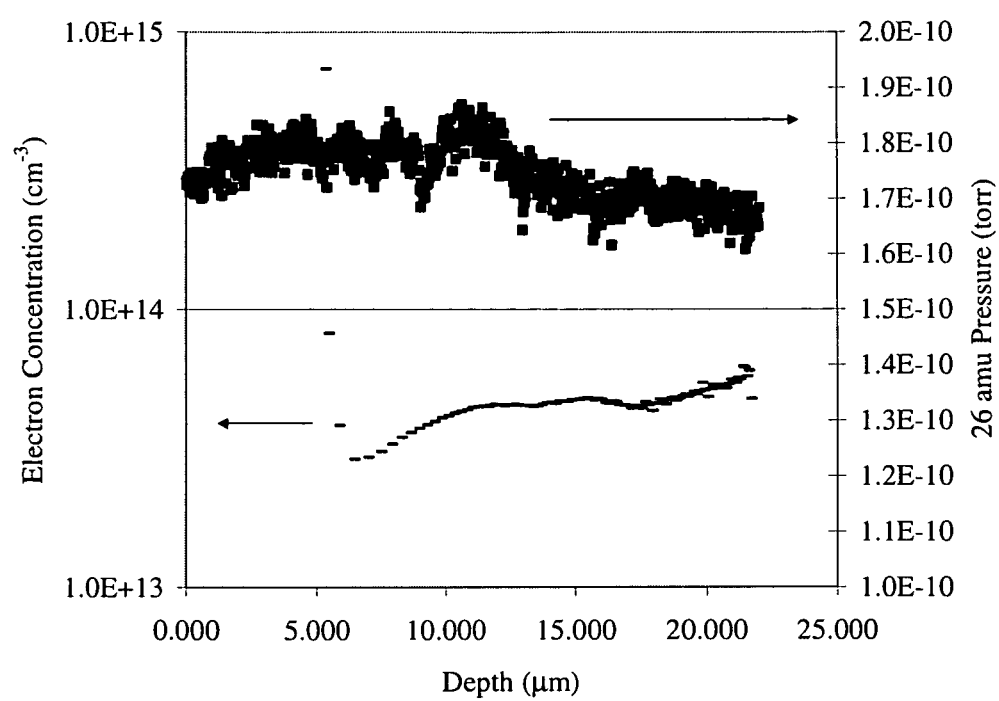
FIG. 12 shows the carrier concentration as a function of depth and variations in the 26 amu peak where there was no intentional variance of the feed ratio.

Unintentional dopant concentrations—This sample was conducted in configuration 2 and with the same growth conditions as Example 2. The amount of unintentional dopants incorporated into the grown SiC layer from impurities in the growth chamber as well as total free carrier concentration that results from these dopant incorporations was determined as a function of the C/Si as measured by the disclosed method to further demonstrate the utility of the method. FIG. 10 shows the concentration of N (a), B (b), and Al (c) atoms in the SiC layer as measured by secondary ion mass spectrometry (SIMS) and the total free carrier concentration (d) as measured by C-V profiling as a function of intentional variations in the C/Si ratio achieved by changing the propane inlet flow, at two different growth rates of 4.46 and 2.00 μm/hr. FIG. 11 shows the results of similar experiments where the C/Si ratio is changed by varying the amount of the silane inlet flow. Finally, FIG. 12 shows the free carrier concentration as a function of depth where there was no intentional variation of the C/Si ratio (i.e., silane and propane inlet flows were fixed). All three of these experiments exhibit the impact of the site competition effect that is dominant at the growing SiC surface and directly demonstrate the impurity incorporation dependence on the C/Si ratio and the correlation of the observed 26 amu pressure to that C/Si ratio. The unintentional variation in C/Si ratio exhibited in FIG. 12 as observed by variations in the 26 amu peak intensity is correlated after the growth to a measured variation in the free carrier concentration from C-V measurements. As the C/Si ratio decreases, indicated by the decreasing 26 amu peak, the corresponding increase in n-type free carrier concentration (shown by the C-V measurement) is in complete accordance with the site-competition effect.

Obviously, many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the clement to the singular.

What is claimed is:
1. A method comprising:
   supplying sources of carbon and silicon at a carbon:silicon ratio into a chemical vapor deposition chamber containing a substrate under conditions effective to cause growth by hot wall chemical vapor deposition of silicon carbide on the substrate;
   collecting exhaust gases from the chamber;
   performing mass spectrometry on the exhaust gases to determine the partial pressure of a carbon or silicon species in the exhaust gases;
   measuring the carrier concentration in the silicon carbide by capacitance-voltage profiling;
   repeating the supplying of sources of carbon and silicon, the collecting of exhaust gases, the performing of mass spectrometry, and the measuring of the carrier concentration one or more times at different carbon:silicon ratios;

creating a correlation curve to correlate the carrier concentration to the partial pressure of the carbon or silicon species;

supplying the sources of carbon and silicon into the chemical vapor deposition chamber containing a second substrate under the conditions effective to cause growth by hot wall chemical vapor deposition of silicon carbide on the second substrate;

collecting exhaust gases from the chamber;

performing mass spectrometry on the exhaust gases to determine the partial pressure of the carbon or silicon species in the exhaust gases;

adjusting the amount of the sources of carbon and silicon entering the chamber in response to the partial pressure of the carbon or silicon species according to the correlation curve to maintain a maximum carrier concentration of $10^{16}/cm^3$ throughout the depth of the silicon carbide;

wherein the exhaust gases are collected at a point having a direct line of sight to the location of silicon carbide growth.

2. The method of claim 1, wherein the carbon source is propane and the silicon source is silane.

3. The method of claim 1, wherein the carbon species is an acetylene species having a mass of 26 amu.

4. The method of claim 1, wherein the adjusting is performed continuously during the silicon carbide growth process.

5. The method of claim 1, wherein the silicon species is a silane species having a mass of 28-31 amu.

6. The method of claim 1, wherein the exhaust gases are collected by a tube that is not degraded during a silicon carbide growth process.

7. The method of claim 1, wherein the substrate is a 4H—SiC substrate, a 6H—SiC substrate, a 3C—SiC substrate, or a polytype SiC substrate.

8. The method of claim 1; wherein the exhaust gases are collected by a tube so that laminar flow of the exhaust gases reaches the collection point of the tube.

* * * * *